United States Patent [19]

Byrne et al.

[11] 4,376,897
[45] Mar. 15, 1983

[54] LOW VOLTAGE SERIAL TO PARALLEL TO SERIAL CHARGE COUPLED DEVICE

[75] Inventors: John J. Byrne, New Canaan, Conn.; Jean M. Ferre, Coudray Montceaux, France; Yelandur R. Gopalakrishna, Wappingers Falls, N.Y.

[73] Assignee: International Business Machines Corp., Armonk, N.Y.

[21] Appl. No.: 162,851

[22] Filed: Jun. 25, 1980

[51] Int. Cl.³ .................. G11C 19/28; H01L 29/78
[52] U.S. Cl. .................................. 377/63; 357/24; 365/183
[58] Field of Search .............. 357/24; 307/221 D; 365/183

[56] References Cited

U.S. PATENT DOCUMENTS

| | | | |
|---|---|---|---|
| 3,967,254 | 6/1976 | Kosonocky et al. | 357/24 R |
| 4,199,691 | 4/1980 | Angle | 307/221 D |
| 4,211,936 | 7/1980 | Kosonocky et al. | 307/221 D |
| 4,306,160 | 12/1981 | Hamilton | 307/221 D |

Primary Examiner—Gene M. Munson
Attorney, Agent, or Firm—James E. Murray

[57] ABSTRACT

This serial to parallel to serial (SPS) charge coupled device (CCD) shift register memory has a serial output shift register with stage gate electrode structures that are interdigitated with the gate electrode structures of each last stage of a plurality of parallel shift registers to transfer interlaced data bits from the parallel shift registers to the serial output register in a sequential order. This is done without employing a fixed voltage midway between the highest clock voltage and reference potential in the parallel registers in what is commonly called a midway store to regulate the transfer of data to the interdigitated gate electrode structures.

3 Claims, 4 Drawing Figures

4,376,897

LOW VOLTAGE SERIAL TO PARALLEL TO SERIAL CHARGE COUPLED DEVICE

BACKGROUND OF THE INVENTION

The present invention relates to a serial to parallel to serial (SPS) charge coupled device (CCD) shift register memory and more particularly to the transfer of data from the parallel shift registers to the serial output shift register of such a memory.

In a certain type of serial to parallel to serial charge coupled device shift register memory, two groupings of sequentially ordered bits are interlaced when they are fed into the parallel shift registers of the memory and as a result are not arranged sequentially when they reach the outputs of those parallel shift registers for shifting out of the memory through the serial output register of the memory. In the Kosonocky et al U.S. Pat. No. 3,967,254, sorting stages are inserted between the end of the parallel shift registers and the serial output shift registers to place the interlaced data back into its original groupings of sequentially ordered bits and then to transfer these groupings one at a time to the output shift register so that the bits then emerge from the output shift register a grouping at a time in ascending sequential order.

The sorting stages in the mentioned Kosonocky et al patent have two interdigitated electrodes. Each electrode has fingers that shield the last stage of a different set of the parallel shift registers from potentials applied by one of two transfer electrodes overlying the interdigitated electrodes. By first applying a transfer pulse to one of the transfer electrodes and then at a different time to the other of the original groupings can be transferred to the output shift register at a different time than data bits from the other of the original groupings. Still another transfer pulse is applied to a third transfer electrode to synchronize the transfer of the separated groupings to the output shift register for the SPS device.

In U.S. patent application Ser. No. 149,377 filed May 13, 1980, and entitled "Serial Parallel Charge Coupled Device Employing A Gate Splitting Technique", one transfer pulse, one of the interdigitated shielding electrodes and the transfer electrode described above were eliminated. This was accomplished by having an output shift register with electrode structures that are interdigitated with the remaining shielding electrode to perform the functions of the shielding electrode and by adjusting the timing of the transfer pulses for the output electrodes to accept the two data bit groupings at different times on different stages of the output electrodes. However, this arrangement added a fix level voltage and an electrode structure to the arrangement shown in the Kosonocky et al patent to provide what is commonly known as a midway store.

THE INVENTION

In accordance with the present invention, the sorting stage arrangement described in U.S. patent application is incorporated into an serial to parallel to serial shift register memory without resorting to the use of a midway store. This enables the reduction in the magnitude of the voltages used in shifting data through the memory thereby reducing heat dissipation and consequently the size of the memory. In addition, a reduction of junction breakdown voltages and gate oxide thicknesses is possible with the reduction in magnitude of the mention voltages and process complexity.

Therefore, it is the object of the present invention to provide a simpler serial-parallel-serial storage matrix.

It is another object to decrease the size of an serial-parallel-serial storage matrix.

THE DRAWINGS

This and other object of the invention can be better understood to the accompanying drawings of which;

DETAILED EMBODIMENT

Figure 1:
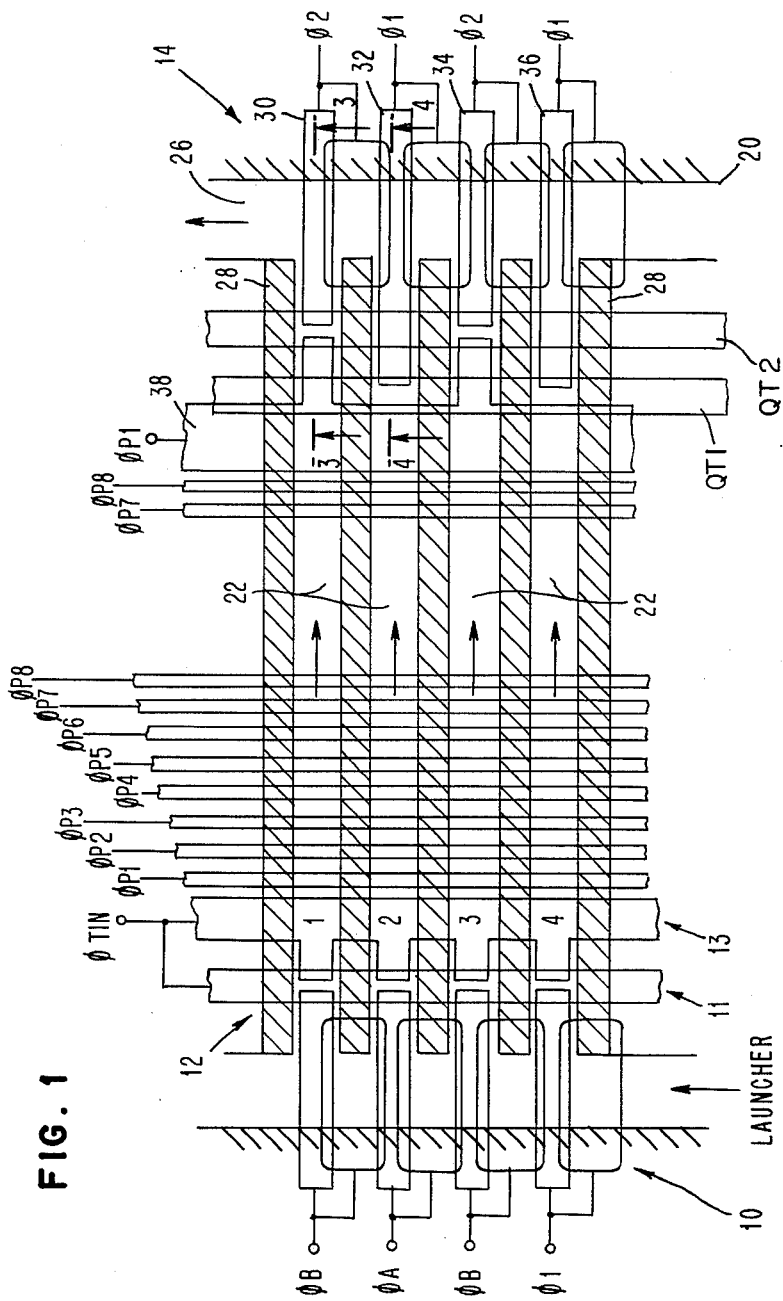
FIG. 1 is a schematic representation of a serial to parallel to serial shift register memory.

Referring now to FIG. 1, a serial to parallel to serial memory contains an input register 10, which receives 4 bits of serial data and transfers each bit to a different one of 4 parallel registers 12. The four data bits are stepped along together in the parallel registers to a serial output register 14 where the bits are placed back into serial form passed out of the memory.

Figure 2:
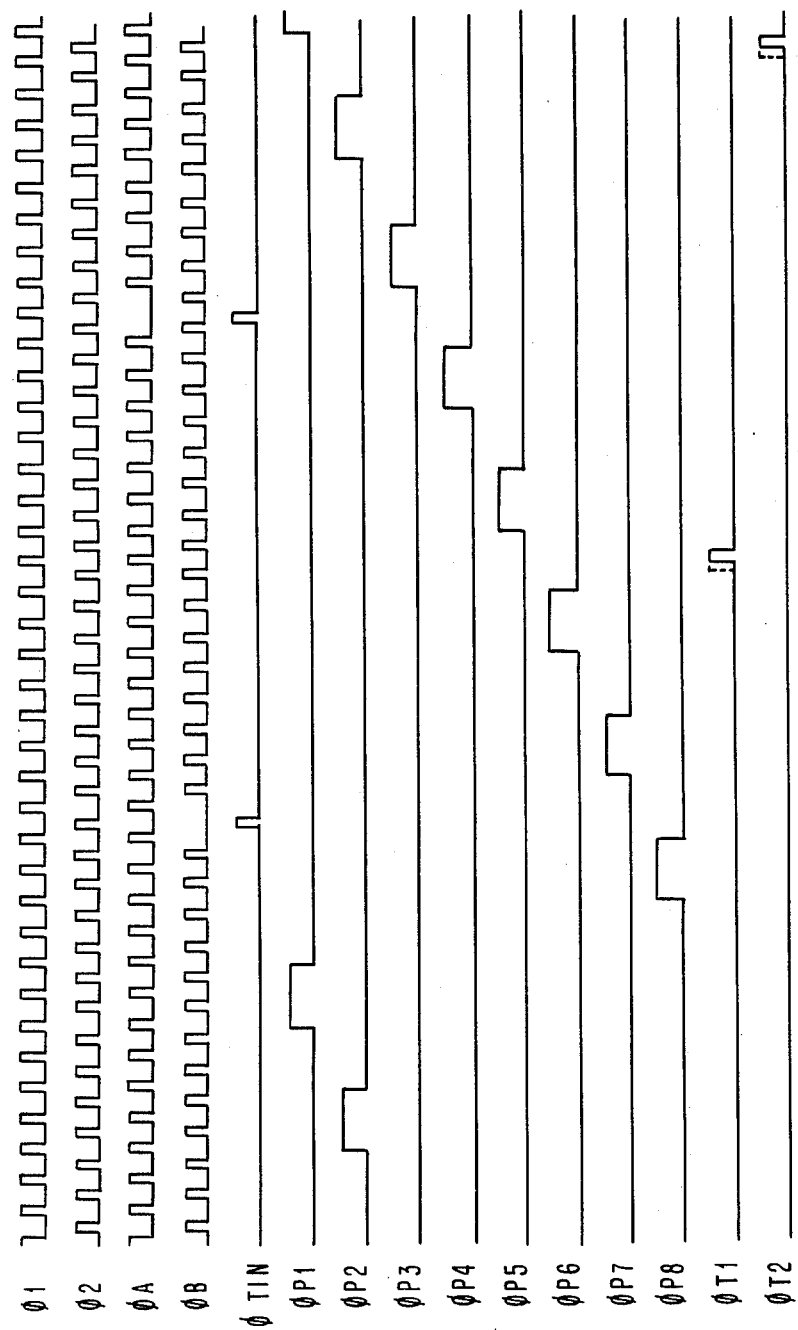
FIG. 2 is a diagram for the pulses used in the memory of FIG. 1.

The $\phi_1$, $\phi_A$ and $\phi_B$ voltages shown in FIG. 2 energize alternate stages of the input register 10 at different times to step the four serial bits data into the register 10 in two groups of 2 bits each. First, bits 1 and 2 are loaded into the shift register 10. When these bits have been stepped into stages 2 and 4 respectively, the $\phi_{Tin}$ pulse comes up on electrode 11 to place them under electrode 13 at the inputs of the 2nd and 4th order parallel registers 12 where order is determined by position from top to bottom. Thereafter, bits 3 and 4 are placed into the input register 10 in stages of 1 and 3 respectively whereupon the $\phi_{Tin}$ pulse comes up again to place bits 3 and 4 under electrode 13 at the input of the 1st and 3rd order parallel registers 12 interlaced between the bits 1 and 2. The $\phi$ P$_1$ to $\phi$ P$_8$ voltages then operate to transfer this byte of interlaced data from stage to stage of the parallel registers 12 until they reach output stages of the registers 12.

As the first 4 bits are moved from stage to stage of the parallel registers, other bits of data are loaded into the parallel registers in the same manner until all stages of the registers 12 are filled with 4 bits of interlaced data. When the parallel registers are filled, the first group of bits 1 to 4 is in position to be transferred into the serial output register 14. However, before transfer out of the parallel registers 12 and into the serial output register, the interlaced bits must be rearranged in order to place them back in ascending numerical sequence.

To better understand how the rearrangement occurs, reference is made to FIGS. 1 to 4. As shown, a P substrate 20 has a plurality of parallel paths 22, defining the channels of the parallel shift registers 12. These paths are joined at their ends by a path 26 defining the channel of the output shift register 16. The paths 22 and 26 are defined by channel stops 28 formed in accordance with known techniques.

A number of electrodes overlay the paths 22 and 26 to control the movement of data in the form of charges along the paths. Gate electrodes 30 to 36 made of polysilicon I overlie channels on an oxide layer. The horizontal electrodes 30 to 36 each define a stage of the output shift register with every other electrode being longer than the electrode between them. The vertical electrode 38 has horizntal segments 42 that oppose the shorter horizontal gates 32 of the output shift register 14. Vertical polysilicon gate electrodes 44 to 50 formed of polysilicon II partially overlie the polysilicon I gate electrodes 26 to 32 on an oxide layer 52 as illustrated. The $\phi_{P1}$ to $\phi_{P8}$, $\phi_{T1}$ and $\phi_{T2}$ control voltages are connected to the gate electrodes as illustrated to transfer data bits in the form of charge packets along the channels 22 to 26. Only two stages of the parallel shift registers 12 are shown. Other stages of these parallel shift registers 16 have gate electrode configurations similar to the arrrangement of electrodes shown connected to the $\phi_7$ and $\phi_8$ sources.

Figure 3:
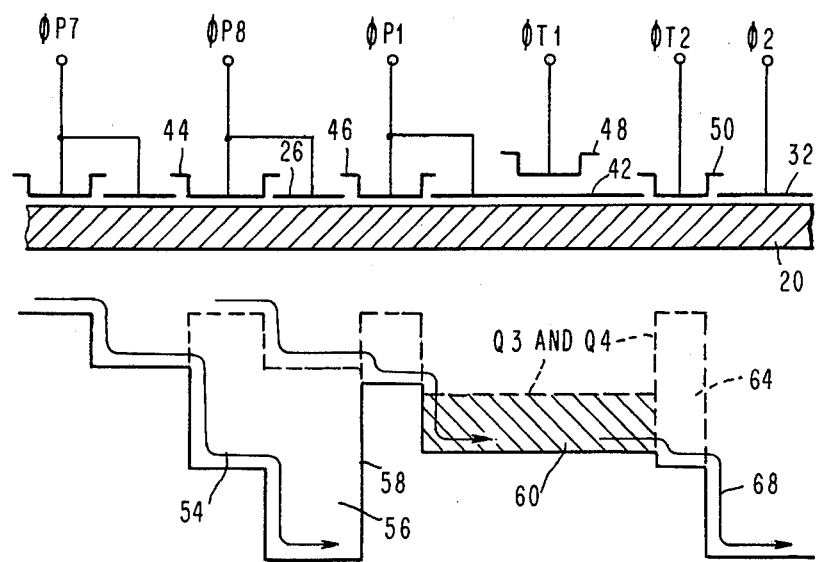
FIG. 3 is a section taken along line 3—3 in FIG. 1.
Figure 4:
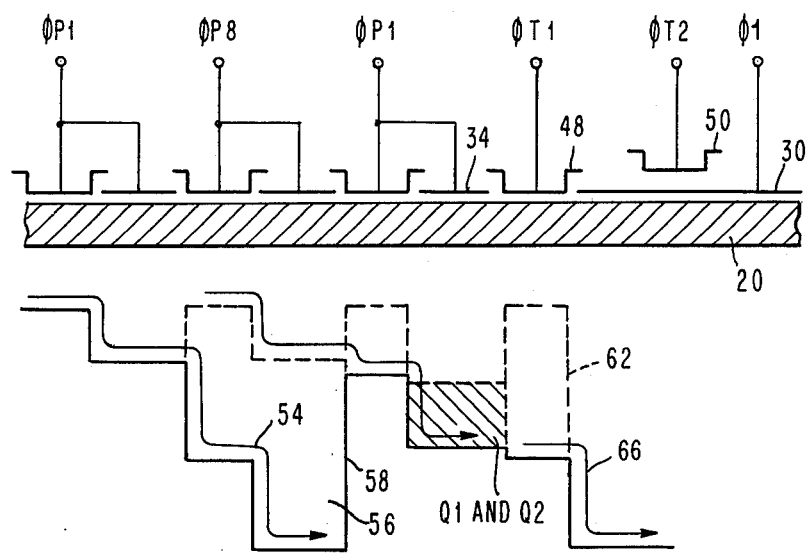
FIG. 4 is a section taken along line 4—4 in FIG. 1.

It can be seen how the voltages on the gate electrodes are controlled to move the charge packets from the output stages of the parallel shift register into the stages of the output shift register 14. FIG. 3 includes the well patterns for bits 3 and 4 while FIG. 4 includes the well pattern for bits 1 and 2. In both figures, when $\phi_{P8}$ goes up while $\phi_{P7}$ is down the charge takes path 54 to the bottom of the well 56 under the last stages of all four parallel shift registers, being blocked to further advance by the barrier established by the low $\phi_{P1}$ potential on electrode 46. When the voltage $\phi_{P1}$ next goes high, this barrier is dropped forming a well 60 under electrode 34. The charge packets $Q_1$ and $Q_2$ for bits 1 and 2 are held from further advance by the barrier 62 established by the low potential $\phi_{T1}$ on electrode 48 while the charge packets $Q_3$ and $Q_4$ for bits 3 and 4 are held from further advance by the barrier 64 established by the potential on electrode 50. The potential $\phi_{T1}$ is raised first allowing the charge packets $Q_1$ and $Q_2$ to move along path 66 into stages in the output register under electrodes 30 where they are shifted out in sequence by the alternation of potentials $Q_1$ and $Q_2$. After the charge packets $Q_1$ and $Q_2$ have been moved out of the output shift register 14, voltage $\phi_{T2}$ comes up dropping the barrier 64 and allowing the charge packets $Q_3$ and $Q_4$ to drop along path into the stages of the output registers under electrodes 32 where they are also shifted out of the output shift registers by out of those alternating pulses of the voltages $\phi_1$ and $\phi_2$.

One embodiment of this invention has been described. Obviously, a number of changes can be made in this invention without departing from the spirit and scope of the invention. Therefore, it should be understood changes in form and details can be made without departing from the spirit and scope of the invention.

Having thus described our invention, what we claim as new, and desire to secure by Letters Patents is:

1. A serial to parallel to serial charge coupled device shift register memory of the type having a plurality of channels in a semiconductor substrate with transfer diodes positioned thereover activated by a series of sequential transfer pulses for transfer of data in the form of charge packets along the parallel channel to form parallel shift registers and additional channel for a single serial shift register at the output ends of said plurality of parallel channels, comprising, a plurality of gate electrodes of two different lengths overlying the channel of said serial register with the longer electrodes also overlying the ends every other of the plurality of channels for said parallel shift registers and the shorter gate electrodes positioned between each two longer electrodes at the end of the intervening channels for the parallel registers, a single gate electrode overlying all of the channels of said parallel shift register adjacent to said plurality of said gate electrodes and having extensions juxtaposed between said longer electrodes and facing said shorter electrodes, said single gate electrode being activated by one of said series of sequential pulses, and transfer electrode means overlying said longer of the plurality of gate electrodes and said extensions for transfer of data from said parallel registers to said serial registers in two groups.

2. The shift register memory of claim 1 including electric pulse means coupled to said plurality of gate electrodes for supplying sequences of pulses to transfer data from said parallel registers to said serial output register in sequential order.

3. The shift register memory of claim 2 wherein said transfer electrode means includes two electrodes which are mutually exclusive activated for transfer of data.

* * * * *